United States Patent
Carlson

(10) Patent No.: US 8,760,952 B2
(45) Date of Patent: Jun. 24, 2014

(54) OVERLAPPING INTERCONNECT SIGNAL LINES FOR REDUCING CAPACITIVE COUPLING EFFECTS

(75) Inventor: David V. Carlson, Woodinville, WA (US)

(73) Assignee: STMicroelectronics, Inc., Coppell, TX (US)

( * ) Notice: Subject to any disclaimer, the term of this patent is extended or adjusted under 35 U.S.C. 154(b) by 300 days.

(21) Appl. No.: 12/971,273

(22) Filed: Dec. 17, 2010

(65) Prior Publication Data

US 2012/0155195 A1  Jun. 21, 2012

(51) Int. Cl.
*G11C 7/02* (2006.01)

(52) U.S. Cl.
USPC ............... 365/206; 365/198; 365/51; 365/72; 365/63

(58) Field of Classification Search
USPC .................. 365/51, 63, 72, 198, 191, 206
See application file for complete search history.

(56) References Cited

U.S. PATENT DOCUMENTS

| | | | |
|---|---|---|---|
| 6,788,561 B2 * | 9/2004 | Watanabe et al. ............... | 365/63 |
| 6,927,992 B1 * | 8/2005 | Yen ................................. | 365/63 |
| 8,102,699 B2 * | 1/2012 | Toda .............................. | 365/148 |

OTHER PUBLICATIONS

Nakata et al., "Multilevel Interconnect Technology for 45-nm Node CMOS LSIs," Fujitsu Sci. Tech., J. vol. 46, No. 1, pp. 120-127, Jan. 2010.
Banjerjee et al., "Interconnect Modeling and Analysis in the Nanometer Era: Cu and Beyond," Proceedings of the $22^{nd}$ Advanced Metallization Conference, Colorado Springs, CO, Sep. 27-29, 2005.
Website: "Interconnect Issues and 45 nm Process," available at: http://maltiel-consulting.com/Interconnect_45nm_maltiel_semiconductor.html, first published 2004, some content added later. Retrieved on Sep. 20, 2010.
Website: "Copper Resistivity Fixable for 45 nm Node, but Long-Term Issues Remain," available at: http://www.physorg.com/news5007.html, Jul. 7, 2005. Retrieved Sep. 20, 2010.

* cited by examiner

*Primary Examiner* — Andrew Q Tran
(74) *Attorney, Agent, or Firm* — Wolf, Greenfield & Sacks, P.C.

(57) ABSTRACT

Described herein are various principles for designing, manufacturing, and operating integrated circuits having functional components and one or more metal interconnect layers, where the dimensions of signal lines of the metal interconnect layers are larger than dimensions of the functional components. In some embodiments, a signal line may have a width greater than a width of a terminal of a functional component to which the signal line is connected. In some embodiments, two functional components formed in a same functional layer of the integrated circuit may be connected to metal signal lines in different metal interconnect layers. Further, the metal signal lines of the different metal interconnect layers may overlap some distance.

18 Claims, 6 Drawing Sheets

OVERLAPPING INTERCONNECT SIGNAL LINES FOR REDUCING CAPACITIVE COUPLING EFFECTS

BACKGROUND

1. Technical Field

Some embodiments relate to integrated circuits having a functional layer including semiconductor components and metal interconnect signal lines overlying the functional components and each other. More particularly, some embodiments relate to integrated circuits having metal layers coupled as respective interconnect signal lines each having a width greater than a width of terminals of functional components to which the respective interconnect signal lines are connected.

2. Discussion of Related Art

Interconnection signal lines in integrated circuits convey signals between functional components or other parts of the integrated circuit, including power signals and information signals. For example, an interconnect signal line may convey a signal between one transistor of the integrated circuit and another transistor of the integrated circuit, or between a transistor and an output terminal, or between other parts of an integrated circuit. In an interconnect layer, signal lines may run parallel to one another in the same plane for some distance across the chip.

Interconnect signal lines have been formed of a variety of materials. In early forms of Static Random Access Memory (SRAM) and Dynamic Random Access Memory (DRAM), signals were relayed through a memory cell using substrate diffusion lines. A substrate diffusion line is formed of a doped semiconductor layer. When a signal is conducted via a signal line, however, the received strength of the signal (i.e., the strength of the signal when received at the destination) is dependent on the transmission strength of the signal and on the conductivity of the signal line. Signal lines that conduct signals via substrate diffusion have a relatively high resistivity that can reduce the received strength of the received signal. To address this problem, polysilicon or silicide layers can be formed on the doped semiconductor layers to reduce the resistivity.

Signal lines have also been formed of metal. Signal lines formed of metal have a much lower resistivity (e.g., two or three orders of magnitude lower) than substrate diffusion lines. Metal signal lines can be located in a plane above functional components of the chip and vertical plugs can connect components to the metal signal lines.

Interconnect signal lines and functional components of integrated circuits have roughly equivalent dimensions, such as roughly equivalent widths. As integrated circuits and semiconductor components have been manufactured in smaller sizes over time, the size of the interconnect signal lines, including metal signal lines, has been reduced. Recently-developed devices have an inter-transistor distance on the order of 45 nanometers and metal signal lines have been created that have a width roughly corresponding to this distance.

SUMMARY

In one embodiment, an integrated circuit has a first semiconductor component and a second semiconductor component in the substrate with a first signal line disposed a first distance from the substrate and electrically connected to the first semiconductor component and a second signal line disposed a second distance from the substrate. The second distance is greater than the first distance. In the integrated circuit, at least a portion of the second signal line is disposed vertically above at least a portion of the first signal line.

In a further embodiment, there is provided a method for reading information signals via a first metal signal line and a second metal signal line of an integrated circuit, where the first and second metal signal lines are adjacent, at least partially overlapping, and separated vertically by a distance. The method comprises reading a first information signal via the first metal signal line and, after waiting a recovery time to allow the second metal signal line to recover from an effect of capacitive coupling with the first metal signal line, reading a second information signal via the second metal signal line.

In another embodiment, there is provided a method of fabricating an integrated circuit. The method comprises performing a first manufacturing process to form an active layer for the integrated circuit, where the first manufacturing process is capable of forming features in the wafer with a first minimum dimension, and performing a second manufacturing process to form at least one interconnect layer comprising a plurality of signal lines for the integrated circuit, where the second manufacturing process is capable of forming features in the wafer with a second minimum dimension and is not capable of forming features in the wafer with the first minimum dimension. In the method, the second minimum dimension is greater than the first minimum dimension.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
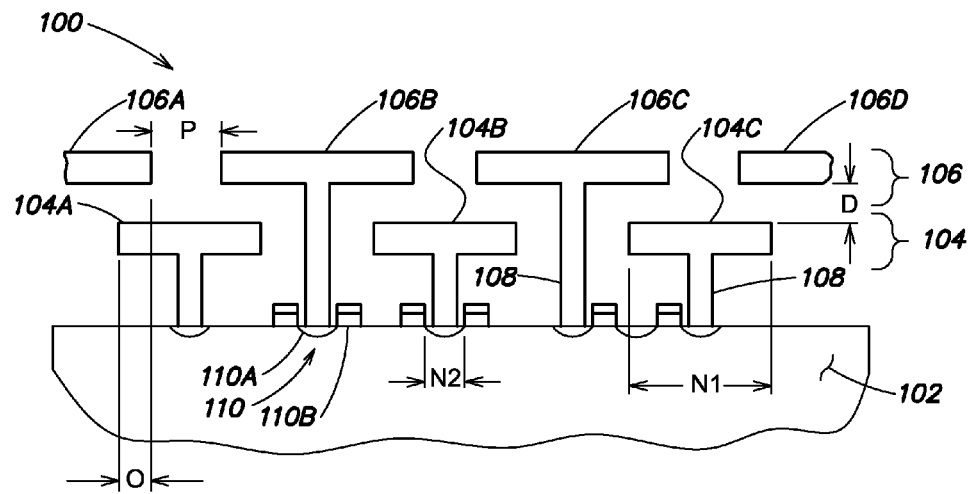
FIG. 1 shows a cross-section of one example of an integrated circuit implemented according to some of the techniques described herein.

When an integrated circuit is formed using conventional techniques, features of both functional components and signal lines of the integrated circuit are often formed with the same dimension. This dimension is typically the minimum dimension size that is possible with the lithographic technique used to form the integrated circuit. The term "minimum dimension" is a known term of art in the semiconductor processing field. The minimum dimension is also sometimes referred to as the minimum geometry or the minimum width. The minimum dimension means the smallest feature size that can be made with a particular semiconductor process technology. The minimum dimension will be the shortest channel length and most narrow gate electrode that can be formed in that particular semiconductor process technology. For example, in a "90 nm process," the minimum dimension is 90 nm. As another example, in a "65 nm process," the minimum dimension is 65 nm. For each semiconductor process technology, the minimum dimension will be a selected value that will remain the same for that particular semiconductor process technology. Of course, not all features of an integrated circuit will have a size equal to the minimum dimension. Some may be larger than the minimum dimension. For example, transistors that need a high breakdown voltage, that need a high operating voltage, or that are designed to carry more power can be several times larger that the minimum dimension of the semiconductor process technology used to manufacture the integrated circuit.

In an integrated circuit, such as a memory array, features of functional components and metal interconnect signal lines can generally be formed at the minimum dimensions. For example, terminals of transistors will have a width equal to the minimum dimension and metal interconnect signal lines will have a width equal to the minimum dimension. Forming these features with the minimum dimension means that a dense area with as many components as possible can be created. Dense areas can be advantageous as they can enable greater functionality. For example, in a memory array, a denser area allow for more memory cells in an area, which allows for more storage in the area and more storage in the chip.

Integrated circuits conventionally maintained a relationship between the widths of interconnect signal lines and dimensions of features of the functional components. Such features of the functional components include, for example, terminals of the functional components, such as functional components in a substrate of the integrated circuit or in a first polysilicon layer of the integrated circuit. For example, when a functional component is an active component like a transistor, the features of the functional components may be a gate of the transistor or the transistor channels. In such cases, the dimensions of the features may be a width of the gate or the length of the channel. These features can be formed at the minimum dimension of the semiconductor process technology used to create the features, as discussed above.

As the minimum dimensions of semiconductor process technologies have decreased, the dimensions of features of functional components of integrated circuits have decreased. The dimensions of metal interconnect signal lines have also decreased correspondingly, to maintain the relationship mentioned above. However, despite this downward trend in size, the dimensions of metal interconnect signal lines have been maintained above a certain, preferred size. Widths of metal interconnect signal lines are preferred to be above this size because, below this size, metal signal lines have undesirable properties. When a metal signal line is formed with dimensions below this lower bound, the resistivity of the metal signal line is significantly higher than metal signal lines having dimensions above the lower bound. As dimensions decrease further below the lower bound, the resistance increases greatly, in some cases non-linearly. Lower resistances are desirable for metal signal lines; metal signal lines having dimensions below the lower bound are therefore not desirable in many applications. This lower bound varies between metals used for signal lines, but in general the lower bound on dimensions is a signal line width of between approximately 22 and 32 nanometers. Designers and manufacturers of integrated circuit may therefore limited by sizes of metal interconnect signal lines.

Designers and manufacturers of integrated circuits that wish to use metal signal lines in their products might also be limited by other properties of minimum dimensions below a selected size. Metal signal lines are also preferred to be separated from one another by a distance that prevents or reduces cross-talk and prevents or reduces signal leakage and capacitive coupling between signal lines. Because functional components are located vertically below signal lines to which they are connected, and the arrangement of metal signals is limited in this way, the arrangement of functional components is also limited.

To avoid this problem and decrease the size of the overall integrated circuit, some designers and manufacturers use substrate diffusion signal lines instead of metal to connect to individual transistors and thereby achieve a small overall circuit. However, substrate diffusion lines have higher resistances than metal signal lines. Additionally, signal lines made of other materials (materials other than metal) may also experience a lower bound on desirable dimensions, as other materials may also have threshold dimensions beyond which electrical characteristics, like resistivity, change in undesirable ways.

Described herein are various principles for designing, manufacturing, and operating integrated circuits that have both functional components and one or more interconnect signal lines, in which the functional components have dimensions smaller than the dimensions of the interconnect signal lines. For example, a signal line may have a width greater than a width of a terminal of a semiconductor component to which the signal line is connected. As another example, if a material of the interconnect signal lines has a lower bound on its desirable dimension and the functional components may have dimensions below this lower bound, the interconnect signal lines are placed in different layers, one above another, and overlap each other so that the metal interconnect signal lines may have dimensions above the lower bound. The signal lines may be made of metal or of any other suitable material based on their desired electrical properties, without concern for their width.

Using some of the techniques described herein, in some embodiments an integrated circuit can be manufactured using two different manufacturing processes. For example, in some embodiments a first portion of the integrated circuit could be manufactured using a first manufacturing process that is able to produce features with a first minimum dimension and a second portion of the integrated circuit could be manufactured using a second manufacturing process that is able to produce features with a second, different minimum dimension that is larger than the first minimum dimension. In some such embodiments, metal signal lines of an integrated circuit can be manufactured using the second manufacturing process and functional components of the integrated circuit can be manufactured using the first manufacturing process. In some cases, as described in more detail below, these techniques can result in a lengthened lifespan for some fabrication equipment or fabrication facilities.

In some integrated circuits where the functional components have dimensions smaller than the dimensions of the signal lines, the functional components are located close together. In these circuits, signal lines to which the functional components of one functional layer of the integrated circuit connect may be placed in different layers and may overlap one another, to enable the signal lines to be made with minimum dimensions larger than the functional components and larger than a lower bound below which the properties of the metal would cause their resistance to increase greatly. By overlapping signal lines that are connected to a same functional layer, the signal lines can be maintained at a width greater than the lower bound discussed above while allowing more signal lines to be created in one area. As more signal lines can be created, more functional components to connect to them can also be created with dimensions smaller than the dimensions of the signal lines and arranged in a higher density. Accordingly, by using overlapping metal signal lines, the size of functional components can be decreased and a number of functional components in an integrated circuit can be increased. Some integrated circuits that are implemented using, or operate according to, techniques described herein may have a density of semiconductor components higher than previously possible in integrated circuits that include signal lines that have dimensions above the lower bound discussed above.

FIG. 1 shows a cross-section of one example of an integrated circuit that may be implemented using techniques described herein. As shown in FIG. 1, the circuit 100 includes a functional layer 102, a first metal interconnect layer 104, and a second metal interconnect layer 106. The signal lines run parallel to one another for some distance through the integrated circuit 100, conveying signals to other parts of the integrated circuit 100. Each of the signal lines 104A, 104B, 104C of the first layer 104 and a corresponding via 108 form a roughly 'T' shape, and each of the signal lines 106A, 106B, 106C, 106D of the second layer 106 and a corresponding via 108 form a roughly 'T' shape. Signal lines of each layer 104 are separated from one another by a gap. The vias 108 coupled to signal lines of the layer 106 extend to a terminal 110A of a functional component 110 via gaps in the layer 104.

The signal lines of layers 104, 106 may be formed from any suitable material or combination of materials. In some embodiments, signal lines may be formed of conductive and/or semiconductive materials. In some embodiments, signal lines may be formed from a metal layer, such as a pure metal layer or a metal alloy layer. A metal alloy layer may include combinations of metals with other metals and/or metals with non-metals.

Each of the signal lines of the layers 104, 106 is connected to a functional component 110 of the functional layer 102 through the via 108 at a terminal 110A. The functional layer 102 includes at least one functional component 110. A functional component 110 of the functional layer 102 is arranged to perform some action or process and may transmit and receive signals via terminals like terminals 110A, 110B. Active components (e.g., a transistor) are one type of functional components. For example, the functional component 110 may be a semiconductor component like a MOS transistor have gate, source, and drain terminals. As the terminals of a functional component 110 are connected through the via 108 to a metal signal line of one of layers 104, 106, a functional component 110 may communicate signals to other parts of the integrated circuit 100 via a signal line.

By coupling functional components of the substrate, through the vias 108, to metal signal lines in different metal layers 104, 106, the minimum feature size of the signal lines (e.g., the width of a signal line) in layers 104, 106 can be increased above the minimum dimension of the functional components (e.g., the width of a transistor gate) 110. The signal lines of layers 104, 106 each have a width N1 while the terminals 110A of functional components 110 each have a width N2. While in conventional devices N1 was equal to or less than N2, in some embodiments of principles described herein, N1 may be larger than N2.

As shown in FIG. 1, at least some of the metal signal lines of layer 104 overlap some distance O with adjacent signal lines from the layer 106. The signal lines overlap such that at least a portion of a signal line 104A is disposed below a portion of a signal line 106A and the overlapping portion of signal line 106A is above the portion of the signal line 104A, when the circuit 100 is considered from the top of FIG. 1. For ease of description, the terms "above" and "below" are used herein to characterize the overlapping portions. These terms are relative, though, as they describe an arrangement of layers relative to an angle from which the layers are considered. For example, a first layer that is "above" a second layer when viewed from one angle may be "below" the second layer from the layers viewed from another angle. The terms "above" and "below" are therefore used herein relative to a direction of arrangement of layers of the circuit 100 in roughly parallel planes.

As discussed above, in some circuits formed according to techniques described herein metal signal lines may have dimensions greater than a lower bound on desirable dimensions for the material(s) of the signal lines and may have dimensions greater than those of functional components. In the embodiment of FIG. 1, each of the signal lines of the layers 104, 106 has a width above the lower bound discussed above, such that each signal line has a width greater than 22 nm, as one example.

As discussed above, each of the functional components 110 and/or terminals 110A may have dimensions smaller than dimensions of the metal signal lines. For example, a width of an entire component (e.g., a width of a transistor) may be less than a width of a metal signal line. Additionally or alternatively, a width of one terminal 110A (e.g., a source, gate, or drain terminal of a MOS transistor) may be less than a width of a metal signal line. In some embodiments, a width of a metal signal line may be three or more times greater than a width of a terminal 110A of the functional component 110 (e.g., a signal line may have a width three times greater than a gate width of a transistor to which the signal line connects). In some embodiments, a metal signal line may extend over an entire width of a functional component 110 (i.e., all terminals and other parts of the component) to which the metal signal line is connected and may extend over a part of or an entirety of one or more adjacent functional components 110.

The width of the metal signal line refers to a horizontal dimension of the metal signal line, perpendicular to a length of the metal signal line. As shown in FIG. 1, the length of a metal signal line 104A extends into the page and the width refers to a horizontal dimension of the metal signal line 104A as it is shown in FIG. 1. "Thickness" of the metal signal lines 104A refers to a vertical dimension of the metal signal line 104A as it is shown in FIG. 1.

A width of a terminal or a width of a functional component is a dimension of the terminal or functional component in the same direction as the width of the metal signal line. Comparing a width of a terminal/component to a width of a signal line therefore includes comparing dimensions in the same direction, rather than dimensions in different directions.

The signal lines of metal interconnect layers 104, 106 extend parallel to one another along paths through the circuit 100 and overlap along at least part of their parallel paths. The distance for which the signal lines overlap may be a substantial part of the path distance, such as nearly all of the path distance or a majority of the path distance. The signal lines of layers 104, 106 may extend through the integrated circuit for a substantial part of length of the integrated circuit, such as for more than a third of the length of the integrated circuit, more than half of the integrated circuit, or nearly all of the length of the integrated circuit. In some cases, the signal lines may extend over other semiconductor components or other features of the integrated circuits. For example, if the integrated circuit is a memory chip, a series of storage cells may be arranged in an array in the integrated circuit. A signal line may convey a signal from a semiconductor component (which may be a storage cell) to another feature of the integrated circuit over multiple other storage cells, such as across all storage cells in a row or column of the array. It should be appreciated, though, that integrated circuits are not limited to being implemented as memory chips and signal lines may extend in any suitable manner through the integrated circuit.

The metal signal lines of one of layers 104, 106 may also be separated from other signal lines of the same layer by a pitch size P. The pitch size P may be any suitable size to prevent electrical connection or capacitive coupling between the metal signal lines. The pitch size P may also be selected to prevent process errors or variations from preventing proper operation of the circuit 100. In some cases, during manufacturing, a metal signal line may be formed with a defect that has, in one area, an edge that bulges out and reduces a desired distance between signal lines. Because of the reduced distance, an electrical connection may be formed between the signal line and adjacent signal lines either by direct connection or due to breakdown of an insulator between the signal lines. The pitch size P of the metal interconnect layers has conventionally been held to be the same as the pitch size of the functional components to achieve connection to individual functional components by the same layer of metal interconnect signal lines. However, in some embodiments, the pitch size P of the metal interconnect layers may be different from a pitch separating functional components 110 of the active layer 102. In some embodiments, the pitch size P of the metal interconnect layers 104, 106 may be double or more a pitch size of the functional components 110. These embodiments will be advantageous in that electrical connections may not form in some cases where a signal line has a bulge due to a process variation, defect in mask alignment, defect in line formation, or other error. In some embodiments, error tolerances may therefore be greatly increased through operating in accordance with principles described herein.

In some cases, the pitch size P may be the same for all metal interconnect layers 104, 106 of the circuit 100, while in other cases the pitch size P may vary between layers.

Each of the metal interconnect layers 104, 106 and the vias 108 are disposed in an insulating material. Use of such an insulating material to fill spaces between metal interconnect layers is known in the art, and insulating materials may be selected that have certain properties as also known in the art. Nanoporous materials, tetraethyl orthosilicate, silicon nitrides, and other high-K insulators can be used for such insulating materials, though any suitable material may be used. This insulating material may be selected to have properties to prevent or limit capacitive coupling between signal lines near one another. Capacitive coupling is prevented when there is no capacitive coupling between signal lines and is limited when capacitive coupling between signal lines is maintained at a level that does not significantly interfere with operation of the integrated circuits and does not significantly interfere with reading signals via the signal lines. Capacitive coupling does not significantly interfere when the signals can be read and processed despite coupling.

The circuit 100 may also be designed or operated in such a manner to prevent, limit, or reduce the effects of capacitive coupling between overlapping signal lines. As shown in FIG. 1, each of the metal signal lines that are adjacent to one another overlap and are separated by a distance D in the vertical direction. The distance D, in one embodiment, is selected to be great enough to prevent or limit capacitive coupling between the adjacent and overlapping signal lines. In some embodiments, all of the metal signal lines are separated by the same distance D from an adjacent, overlapping metal signal line. In other embodiments, some metal signal lines may be separated by a first distance D to prevent capacitive coupling while other metal signal lines may be separated by a second distance greater than or equal to the distance D. Some metal signal lines may be separated by the greater distance when, for example, an expected voltage difference between the signal lines may be large, as the likelihood of capacitive coupling between the signal lines increases with an increase in voltage difference.

In some embodiments, while some adjacent and overlapping metal signal lines may be separated by a first distance D as shown in FIG. 1, other metal signal lines may be formed in different interconnect layers that are separated by a second distance less than D. The other metal signal lines that are not separated by less than the first distance D may not be adjacent or overlapping.

Figure 2:
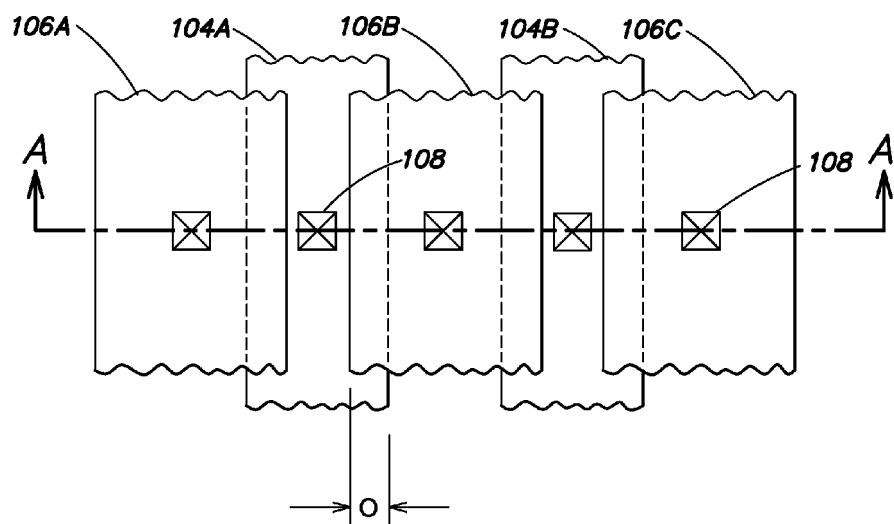
FIG. 2 shows the top view of the integrated circuit illustrated in FIG. 1.

FIG. 2 shows the circuit 100 of FIG. 1 from a top view, to provide another illustration of the overlapping interconnect layers. Line A marks the line at which the cross-section shown in FIG. 1 extends.

As shown in FIG. 2, the signal lines 104A, 104B extend parallel to one another and parallel to the signal lines 106A, 106B, 106C. Additionally, the signal lines 106A, 106B, 106C overlap the signal lines 104A, 104B by a distance O. FIG. 2 also shows the vias 108, which extend from the signal lines to the functional components 110 (not shown). FIG. 2 shows the vias 108 having a roughly rectangular shape. In some embodiments, a shape of the via 108 may depend on a shape of a terminal 110A to which the via 108 connects, as in these embodiments the via 108 may be shaped to fill an entire surface area of the terminal 110A. Accordingly, in other embodiments the vias 108 may be square or cylindrical, or any other shape.

While in FIGS. 1 and 2, the metal signal lines are shown overlapping the same amount, in other embodiments an overlap distance may vary between metal signal lines.

Figure 3:
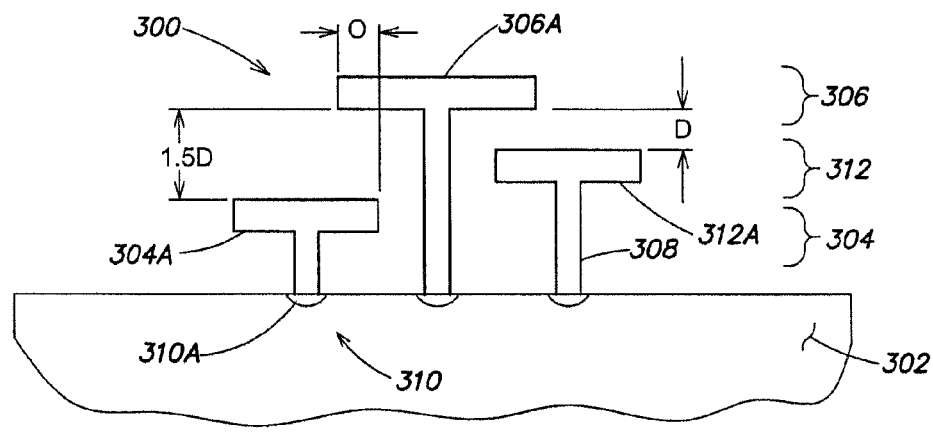
FIG. 3 shows a cross-section of another example of an integrated circuit implemented according to some of the techniques described herein.

FIG. 3 shows a circuit 300 of an alternative embodiment that is able to limit capacitive coupling. Similar to the circuit 100, the circuit 300 includes an functional layer 302 in which are formed functional components 310 having terminals 310A. The circuit 300 also includes at least three metal interconnect layers 304, 306, 312, each having metal signal lines connected to terminals 310A via structures 308. Adjacent metal signal lines overlap by a distance O.

In this embodiment, to prevent or limit capacitive coupling between adjacent metal signal lines, the metal signal lines are separated by at least a minimum distance D, which is selected based at least on desired characteristics of the circuit including timing and voltage levels. As shown in FIG. 3, a signal line 304A of the layer 304 is separated from an adjacent metal signal line 306A of the layer 306 by a distance equal to 1.5 times the minimum distance D (i.e., 1.5 D). The signal line 306A of layer 306 is separated by the minimum distance D from an adjacent metal signal line 312A of layer 312. As a result, metal signal lines 304A and 312A are located in layers 304, 312 that are only half of the minimum distance apart as necessary to prevent or limit capacitive coupling. However, as signal lines 304A and 312A are not overlapping, there is a reduced chance of capacitive coupling between those lines and the lines do not need to be separated by the minimum distance D to prevent or limit capacitive coupling.

Embodiments may therefore stagger metal interconnect layers, such that a vertical distance between any two metal signal lines (e.g., non-overlapping signal lines) may be less than the minimum distance D to prevent capacitive coupling but a vertical distance between adjacent and overlapping signal lines may be at least the minimum distance D.

While in the embodiment of FIG. 1 all metal signal lines were separated by some minimum distance D (which may be selected to be different between circuits) to prevent or limit capacitive coupling, and in FIG. 3 adjacent metal signal lines were separated by at least the minimum distance D, in some embodiments circuits may have metal signal lines subject to capacitive coupling but that are operated in a way to reduce the effects of capacitive coupling on the circuit. Circuits may be operated in this way both when the signal lines are separated by a minimum distance D (to further reduce the effects of capacitive coupling) or when signal lines are not separated by a minimum distance D.

Figure 4:
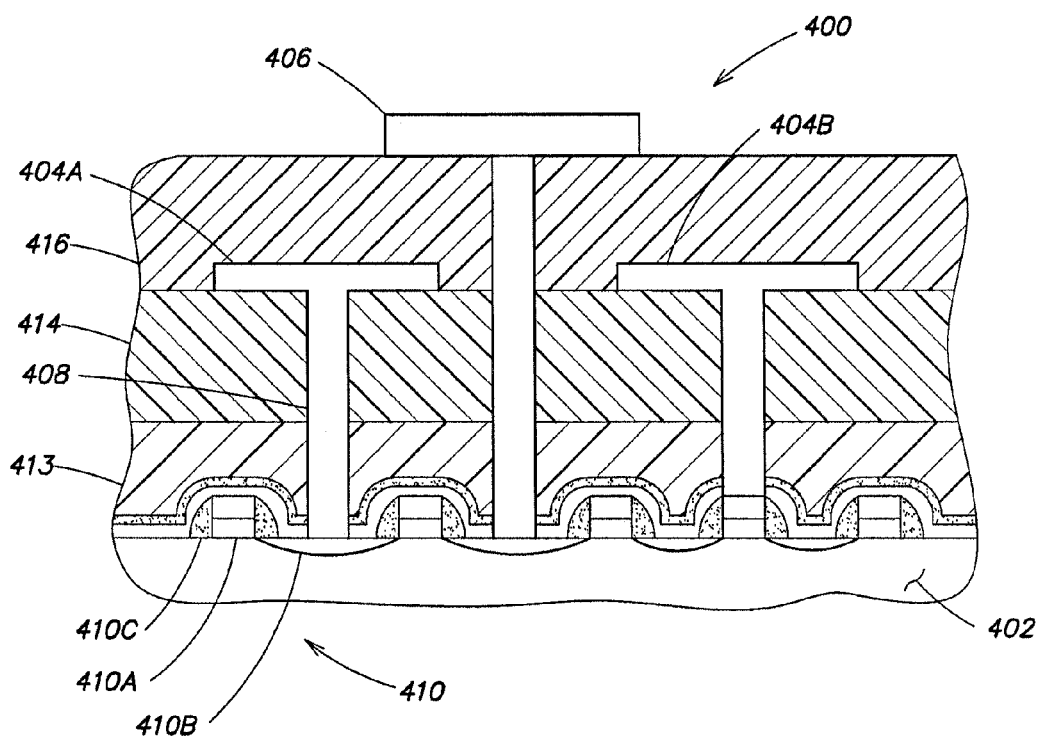
FIG. 4 is a cross-section of one example of an integrated circuit, implemented according to some of the techniques described herein, that illustrates insulating regions present in the circuit.

As mentioned above, integrated circuits operating according to techniques described herein will include insulating regions separating components of the circuits. These insulating regions were not illustrated in the examples above. FIG. 4 is an illustration of one example of an integrated circuit that includes the insulating regions of the integrated circuit.

The circuit 400 of FIG. 4 includes similar elements to circuit 100 of FIG. 1 with insulation layers shown. Circuit 400 includes a functional layer 402 including a functional component 410. Various dielectric layers 413, 414, 416 overlay the functional layer 402. Each of the dielectric layers 413, 414, 416 may be composed of one of more sublayers. For example, layer 413, the first pre-metal dielectric, may be composed of a silicon nitride, an undoped oxide, a borophosphosilicate glass (BPSG) layer, and an upper silicon nitride layer. The other dielectric layers 414, 416 may also be composed of one or more sublayers. For example, the layers 414, 416 may include a low-K dielectric as one sub-layer and various oxides and nitrides as other sublayers. Circuit 400 additionally includes metal signal lines 404A and 404B disposed in one layer and metal signal line 406 disposed in a different layer. Metal signal lines 404A, 404B, 406 are disposed above different insulating layers. Metal signal lines 404A, 404B are disposed above the second dielectric layer 414 and metal signal line 406 is disposed above the third dielectric layer 416. The metal signal line 406 overlaps metal signal lines 404A, 404B as discussed above and illustrated in the prior figures. The signal lines 404A, 404B, 404C are each coupled to the substrate with a via 408. FIG. 4 also illustrates that functional component 410 with terminals 410A and 410B, as well as sidewall spacers 410C surrounding the terminals 410B.

Figure 5:
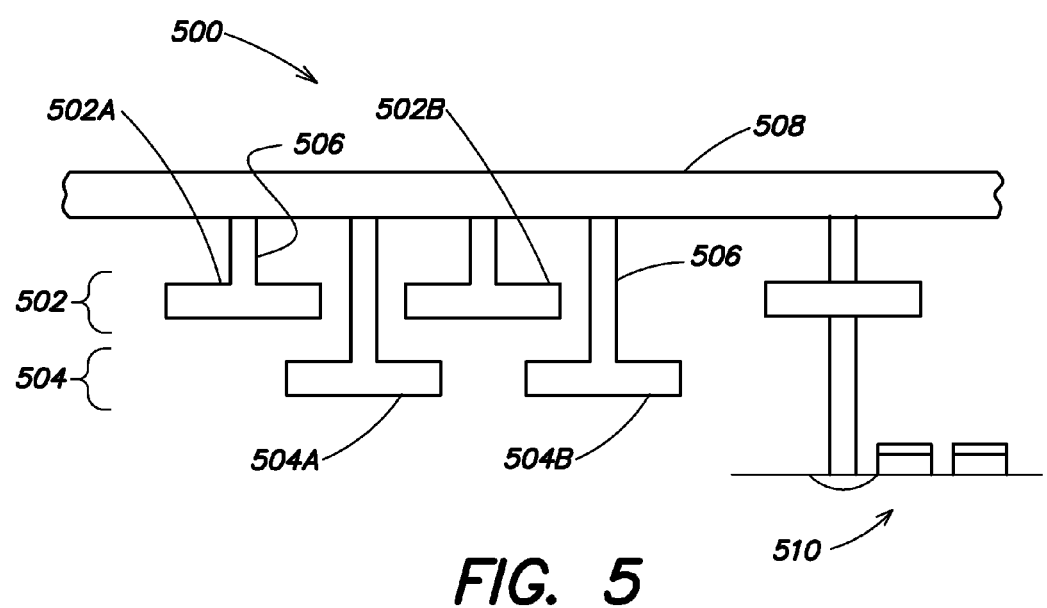
FIG. 5 shows one example of a readout circuit for reading data in an integrated circuit implemented according to some of the techniques described herein.
Figure 6:
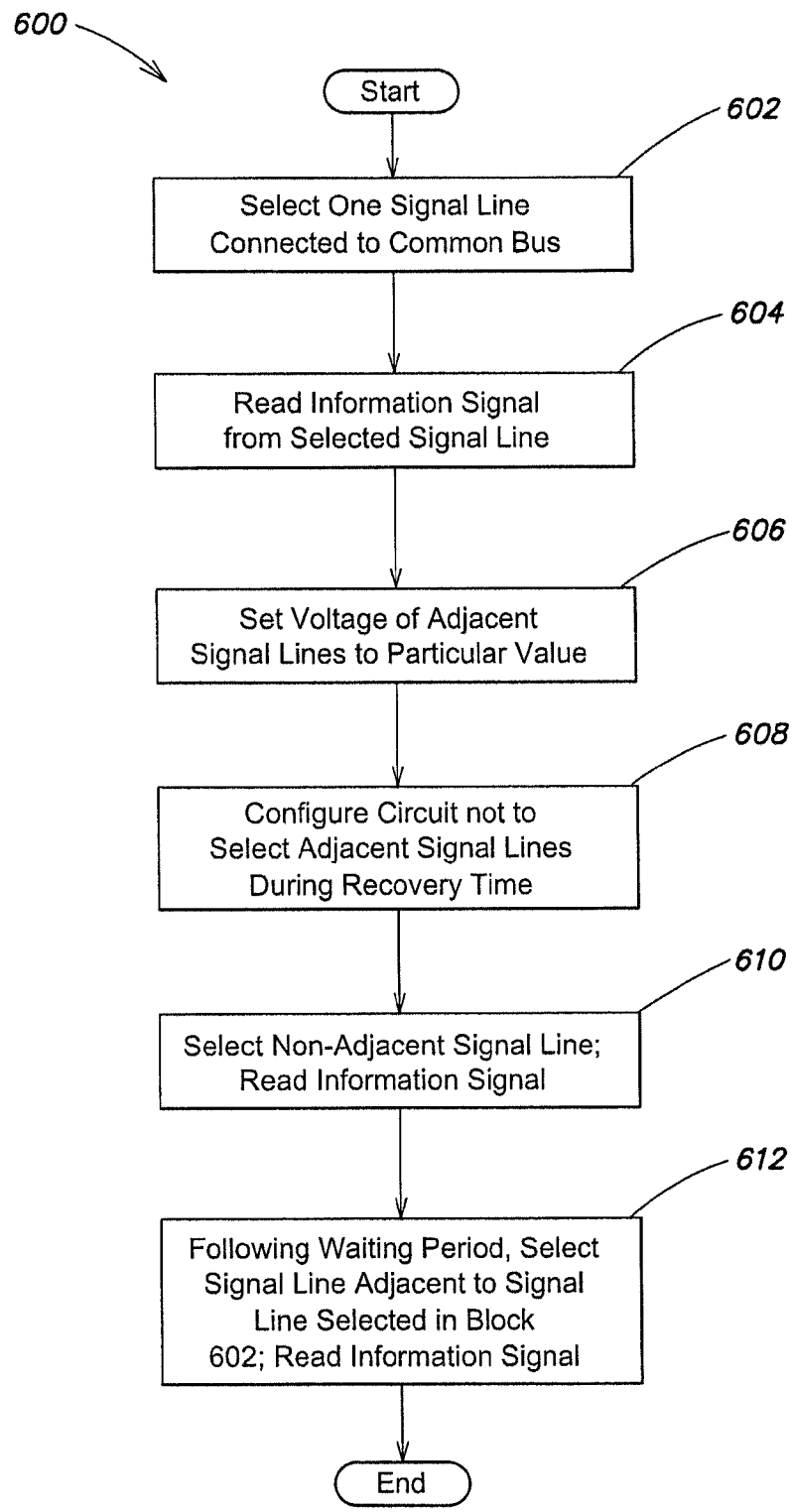
FIG. 6 is a flowchart of one example of a technique for controlling the readout circuit of FIG. 5 to read data.

FIG. 5 shows an embodiment of a circuit 500 that is operated in ways to reduce the effects of capacitive coupling on the circuit 500. FIG. 6 illustrates a process 600 for operating the circuit 500.

As shown in FIG. 5, the circuit 500 includes two metal interconnect layers 502, 504 each including metal signal lines. Some of the metal signal lines of the layers 502 overlap with metal signal lines of the layer 504, as in embodiment discussed above. Each signal line of layers 502, 504 is a bitline of a memory device and each is connected via a structure 506 to a common bus line 508.

The bus line 508 by which signals are read from signal lines of the metal interconnect layers is formed in a first metal interconnect layer vertically above the second metal interconnect layer 502 (comprising signal lines 502A, 502B) and third metal interconnect layer 504 (comprising signal lines 504A, 504B) in the circuit 500. The bus line 508 has a path perpendicular to the path of the signal lines of the layers 502, 504. The bus line 508 may act as a wordline of the memory device of circuit 500.

The bus line 508 is connected to a readout circuit 510, which may be implemented in any suitable manner to read information signals from one or more of the metal signal lines of layers 502, 504 so as to read information from the memory device. For example, the readout circuit 510 may be implemented as a sense amplifier.

The process 600 begins in block 602, in which one of the signal lines of layers 502, 504 is selected to be read by the readout circuit 510. The readout circuit 510 may select the signal line in block 602 in any suitable manner, including according to a predetermined order, in response to a stimulus from a component not shown in FIG. 5 (e.g., a request to read data from a component connected to the selected signal line), or in response to a stimulus from the selected signal line (e.g., an indication that data is to be output), among other ways.

In block 604, an information signal is read from the signal line selected in block 602 by the readout circuit 510. At a same time, in block 606, adjacent signal lines to the selected signal lines are set to a voltage value to reduce a voltage difference with the selected signal line and reduce capacitive coupling between the signal lines. The voltage value may be one equivalent to a voltage read out from the selected signal line, a voltage expected to be read out of the selected voltage line, a predetermined voltage selected to reduce effects of capacitive coupling, or any other suitable voltage for reducing a voltage difference. In some cases in which the voltage read from the selected signal line in block 604 may change during the reading, then setting the voltage value of adjacent signal lines in block 606 may include varying the voltage value during the reading of block 604.

Once the information signal has been read from the selected signal line in block 604, then the information signal may be processed and/or output in any suitable manner, as embodiments are not limited in this respect.

Following the reading, in block 608, the readout circuit 510 may be configured not to select (or another component may be configured not to operate the readout circuit 510 to select) adjacent signal lines to the selected signal line for some period of time, to permit the adjacent signal lines to recover from the effects of capacitive coupling. Recovering from the effects may include returning to a steady-state voltage value on the adjacent signal lines, reducing a charge on the insulator separating the signal lines, or any other suitable resetting. Reading out signals from the adjacent signal lines before the adjacent signal lines have recovered may result in the information signal from being improperly read, such as by resulting in the information signal having an incorrect voltage value.

The readout circuit 510 may then, in block 610, select and read another signal line, according to a same process as discussed above in block 602. The signal line selected in block 610 is one that is not subject to a waiting period following reading of an adjacent signal line.

In block 612, after the waiting period of block 608, the readout circuit 510 selects and reads a signal from a signal line that is adjacent to the signal line read in block 602. In this way, despite that the adjacent signal line may have been subjected to some effects of capacitive coupling due to the reading of block 604, the circuit is operated in such a way to prevent the capacitive coupling from interfering with the circuit's operation or to limit the effects of the capacitive coupling on the circuit.

After the signal line is selected and read in block 608, the process 600 ends.

As discussed above, embodiments are not limited to implementing the process 600 shown in FIG. 6, as others are possible. Some embodiments may implement a process similar to that shown in FIG. 6, with some changes. For example, rather than holding the adjacent signal lines to some voltage value, as in block 606, in some embodiments the adjacent signal lines may be permitted to electrically float. As another example, rather than selecting another, non-adjacent signal line during the waiting/recovery period of the adjacent signal line, as in block 610, the readout circuit may wait and not read any signal lines during the waiting period, to allow all signal lines to recover from potential coupling and not merely the adjacent signal lines. During this time, another readout circuit connected to other signal lines (not illustrated in FIG. 5) may be operated to read a value from a signal line. As a further example, rather than passively waiting while adjacent signal lines recover from possible effects of capacitive coupling, the readout circuit 510 (or another component of the circuit 500) may take one or more actions to recover the adjacent signal lines, such as by grounding the signal lines.

Further, while the process 600 of FIG. 6 focused on a reading of information signals from a signal line, embodiments may also implement similar processes for writing information signals to a signal line that take similar precautions regarding capacitive coupling.

Figure 7A:
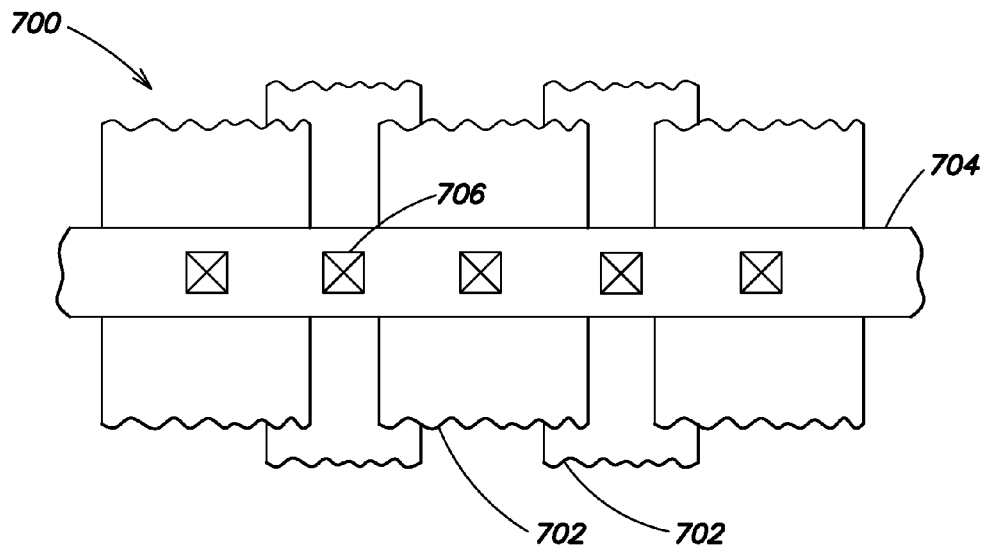
FIGS. 7A and 7B show two examples of ways of connecting word lines to interconnect signal lines that may be used in some embodiments.
Figure 7B:
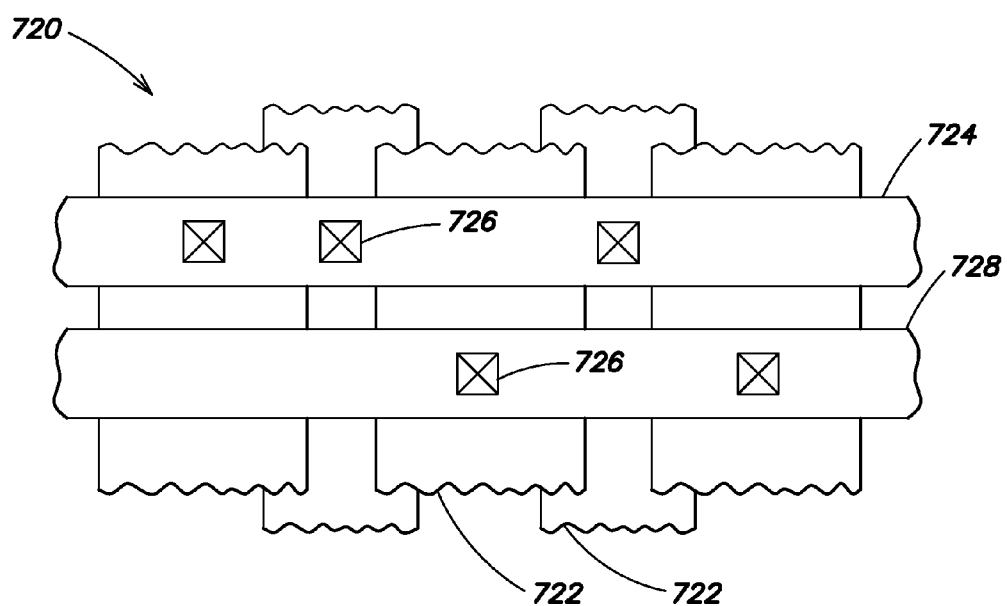

FIGS. 7A and 7B show two exemplary ways of connecting perpendicular metal interconnect layers to the overlapping, parallel signal lines.

In FIG. 7A, a circuit 700 includes multiple overlapping, parallel signal lines 702 that may be formed in two or more metal interconnect layers. The circuit 700 also includes a bus 704. Each of the parallel signal lines 702 of the overlapping, parallel interconnect layers is connected to the bus 704 via a structure 706. In this way, each of the signal lines 702 may be connected to a same bus line 704.

In FIG. 7B, a circuit 720 includes multiple overlapping, parallel signal lines 722 that may be formed in two or more metal interconnect layers. The circuit 720 also includes two buses 724, 728. Each of the parallel signal lines 722 of the interconnect layers is connected to one of the buses 724, 728 via a structure 726. In this way, multiple bus lines 724, 728 may be used and each of the signal lines 722 may be connected to at least one bus line 724, 728.

It should be appreciated that any suitable materials can be used to form the exemplary circuits described above. For example, metal signal lines of metal interconnect layers can be formed using any suitable metal or metal alloy, including alloys of metals with other metals or metals with non-metals. Examples of metals that may be used to form the metal signal lines include aluminum and copper. Additionally, the structures connecting metal signal lines and functional components (e.g., via 108 of FIG. 1) or connecting metal signal lines together (e.g., structure 706 of FIG. 7A) may be formed of any suitable conductor, including tungsten or polysilicon. Further, as discussed above, the integrated circuit may be designed and operated for any suitable purpose, as embodiments are not limited to working with any particular type of integrated circuit. Accordingly, the functional components of the integrated circuits may be any suitable components arranged to perform any suitable function.

As discussed above, embodiments implemented according to techniques described herein have metal signal layers that have dimensions larger than the dimensions of functional components. For example, a width of a metal signal line may be greater than a width of a terminal of a functional component to which the metal signal line connects. The metal signal line may, in some cases, be up to three times larger in size than the terminal of the functional component.

In some embodiments, an integrated circuit with functional components and metal interconnect layers having different dimensions may be manufactured using a single set of circuit manufacturing equipment. Using the single set of equipment, the signal lines of metal interconnect layers may be manufactured using equipment that is able to create features having dimensions smaller (or even much smaller) than the dimensions of the metal signal lines.

In other embodiments, though, multiple different sets of equipment or multiple different processes may be used to manufacture an integrated circuit. Such a technique may be useful for extending a life of a fabrication facility or fabrication equipment.

Fabrication facilities for integrated circuits are expensive to establish and maintain. Such facilities include many pieces of advanced, expensive equipment designed to create circuits with features having microscopic sizes, including the nanoscale devices discussed above. This equipment is designed and operated according to processes for creating circuits having a minimum dimension, which is typically the smallest possible dimension at the time the equipment was designed and manufactured. However, advances in semiconductor manufacturing techniques mean that the dimensions of devices are constantly being shrunk and that fabrication equipment designed to create devices with a certain minimum size is out-of-date soon after the equipment is designed or created. Companies that run fabrication facilities are therefore continually building new fabrication facilities (or upgrading equipment at facilities) to take advantage of smaller sizes possible due to new advances. When a new fabrication facility is built or upgraded, which may be very soon after the old facility was first built, the old facility or old equipment may be no longer used or may be used less often. Because of this, the life of a fabrication facility or fabrication equipment can be quite short and companies may find a return on investment for creating or upgrading such facilities relatively small. Extending the life of these facilities or this equipment would be advantageous, as the return on the investment for the facilities/equipment could be increased.

As discussed above, in some embodiments metal signal lines of an integrated circuit can have dimensions larger than the dimensions of features of functional components of the integrated circuit. As such, if the same manufacturing process were used to manufacture both the metal signal lines and the functional components, the metal signal lines would be formed with dimensions larger than the minimum dimension of the manufacturing process. These larger dimensions, however, may be manufacturable using a different, older manufacturing process and/or different, older manufacturing equipment that is able to make features with a larger minimum dimension. The metal signal lines could, therefore, be manufactured using the different process and/or different equipment. By doing so, a life of older facilities or older equipment could be extended by manufacturing the metal interconnect layers on the older facilities/equipment while the functional components may be formed using newer facilities/equipment.

Accordingly, in some embodiments, a manufacturing process for creating integrated circuits according to techniques described herein may use different processes, different equipment, and/or different facilities for manufacturing different parts of the same chips. More particularly, a process for manufacturing a chip may include manufacturing the metal interconnect layers using a first manufacturing process and manufacturing the functional components using a second manufacturing process. For example, in some embodiments a first set of process equipment may be used to form transistor components in a wafer, such as the gate, source, drain, and contacts through insulation layers to those regions. This first set of process equipment may be able to produce features having a first minimum dimension, for example, a very small minimum dimension like 18 or 22 nm. In these embodiments, the wafer may then be transported to another manufacturing facility having a second set of process equipment and metal signal lines may be formed in the wafer using the second set of process equipment. The second set of process equipment may be able to create features in the wafer with a second minimum dimension larger than the first minimum dimension, for example, 90 nm. This second set of process equipment may be an older set of process equipment, such as equipment that was purchased when the prevailing minimum dimension in the industry was the second minimum dimension. Conventionally, the older set of process equipment would be abandoned, but using the older set of process equipment in this way extends the life of the equipment and increases the return on investment for the equipment. Additionally, using the second set of process equipment can save the expense of buying new equipment to use in creating metal signal lines at the desired dimensions. A manufacturer is therefore able to advance chips to a new process flow at new, lower minimum dimensions merely by obtaining and using new equipment, able to produce features at a new minimum dimensions, for the transistor component formation and then using older equipment for metal interconnect layers. This may save considerable amounts of money and realize the same benefits of advanced manufacturing technologies.

Figure 8:
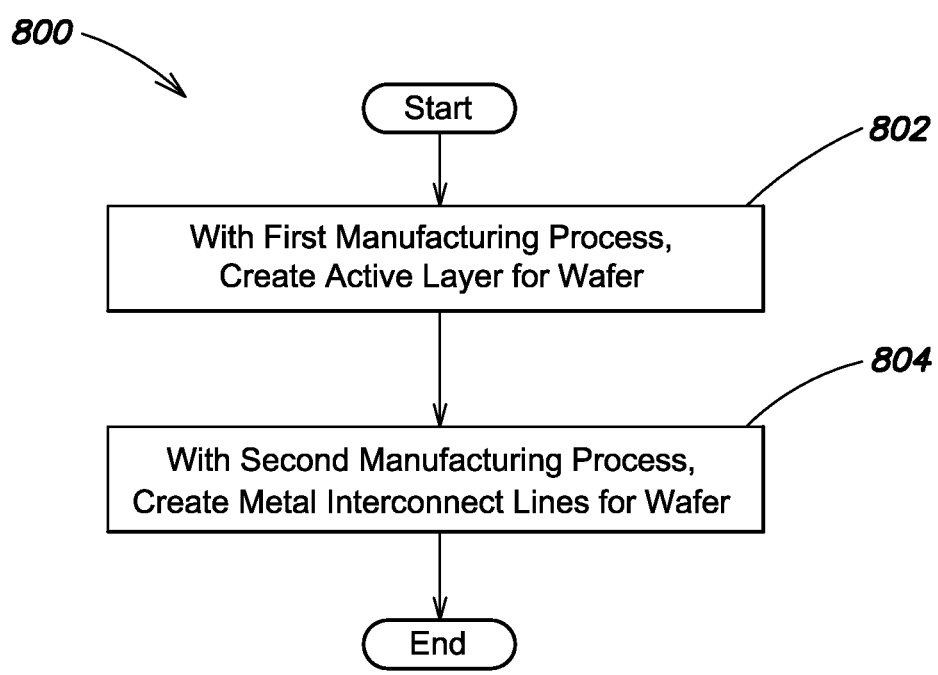
FIG. 8 is a flowchart of one example of a process for manufacturing integrated circuits that are implemented according to some of the techniques described herein.

FIG. 8 illustrates one process 800 for creating integrating circuits according to techniques described herein. Embodiments are not limited to creating integrated circuits according to the exemplary techniques shown in FIG. 8, as other techniques are possible.

In the example of FIG. 8, the manufacturing processes are performed on a wafer from which integrated circuits may be formed. Embodiments are not limited, however, to performing manufacturing processes on a wafer.

Process 800 begins in block 802, in which a first manufacturing process is carried out using first manufacturing equipment to create an active layer on a substrate. The active layer created in block 802 includes functional components having a first dimension. Creating the active layer in block 802 may also include coating the active layer in any suitable other layer, including any suitable dielectric layer, to separate the active layer from subsequent layers to be formed.

In block 804, a second manufacturing process is carried out on a circuit resulting from the process of 802 to add to the circuit two or more metal interconnect layers. The second manufacturing process of block 804 is able to create features in an integrated circuit having a minimum size greater than that of the minimum size of the first manufacturing process of block 802. Forming the two or more metal interconnect layers may include forming parallel signal lines that overlap some amount and may include forming any suitable layer, including any suitable insulating layer, between the signal lines.

The second manufacturing process may be carried out using the first manufacturing equipment in a different way, so as to form features with a larger minimum dimension, or may be carried out using second manufacturing equipment different from the first manufacturing equipment. In some cases, the second manufacturing equipment may be located at a second facility different from, and geographically separated from, a first facility at which the first manufacturing equipment is located. In cases in which different equipment or facilities are used, the process 800 may also include transporting the integrated circuit between equipment/facilities.

After the metal interconnect layers have created, then the process 800 ends.

Embodiments are not limited to implementing the exemplary process 800 illustrated in FIG. 8, as other processes are possible. In one alternative embodiment, the metal interconnect layers may be formed before the active layer, such that the second manufacturing process may be carried out before the first manufacturing process. In another alternative embodiment, rather than manufacturing an integrated circuit with an active layer (e.g., forming a wafer with an active layer) and then depositing on that same integrated circuit two or more metal interconnect layers (e.g., depositing the metal interconnect layers on the wafer), the active layer and the metal interconnect layers may be manufactured separately and, after manufacture, combined to form the integrated circuit. In such a case, the second manufacturing process does not have to be performed after the first manufacturing process. Rather, the second manufacturing process can be performed at any time, independent of a time at which the first manufacturing process is carried out.

The techniques described herein can be used with any suitable type of integrated circuit, as embodiments are not limited to operating with any particular type of integrated circuit. For example, any of the exemplary integrated circuits described herein (e.g., integrated circuit 100 of FIG. 1) may be any suitable circuit that may include any suitable semiconductor device. The integrated circuits may be, for example, an entirety of or portion of a memory circuit, a photodetector, a microprocessor, or any other suitable integrated circuit. Further, while in the examples above the signal lines have been described as being composed of metal (e.g., pure metal or metal alloys), embodiments are not limited to using metal signal lines and may use signal lines made of any suitable material. Additionally, while not illustrated or discussed explicitly in the examples above, each of the signals lines may be connected to any suitable features of an integrated circuit 100 to convey signals between the features. For example, the signal lines may be connected between a semiconductor component and one or more other features of the integrated circuit. Other features may be any suitable active or inactive feature of the circuit 100, such as another signal line or another semiconductor component. Examples of other features include transistors, input/output terminals, power terminals, power lines, buses (e.g., memory word lines), sense amplifiers for reading a signal from the signal line, or any other suitable feature. The signal line may also convey any suitable signals, depending on which features of the circuit are connected by the signal line. Such signals include power signals and information signals, though the signal lines are not limited to carrying any particular signal or type of signal.

Embodiments have been described in which some of the techniques disclosed above are implemented in circuitry. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Having thus described several aspects and various embodiments, it is to be appreciated that various alterations, modifications, and improvements may be made. Such alterations, modifications, and improvements are intended to be part of this disclosure, and are intended to be within the spirit and scope of the principles described herein. Accordingly, the foregoing description and drawings are by way of example only.

What is claimed is:

1. An integrated circuit comprising:
   a first layer having a first semiconductor component and a second semiconductor component;
   a first signal line disposed a first distance from the first layer, the first signal line being electrically connected to the first semiconductor component; and
   a second signal line disposed a second distance from the first layer, the second distance being greater than the first distance, the second signal line being electrically connected to the second semiconductor component,
   wherein:
      the first signal line and the second signal line extend across the integrated circuit for a third distance in a direction,
      a plurality of other semiconductor components are arranged in a line in the direction,
      at least a portion of the second signal line is disposed vertically above at least a portion of the first signal line for at least the third distance, and
      the first signal line is disposed vertically above the plurality of other semiconductor components.

2. The integrated circuit of claim 1, wherein the first semiconductor component comprises a terminal, the terminal having a first width,
   wherein the first signal line has a second width, the second width being greater than the first width; and
   wherein the integrated circuit further comprises a via electrically connecting the terminal to the first signal line.

3. The integrated circuit of claim 2, wherein the first semiconductor component has a third width, the second width of the first signal line being greater than the third width of the first semiconductor component.

4. The integrated circuit of claim 3, wherein a first interconnect layer comprises the first signal line and a third signal line each disposed at the first distance from the first layer, the third signal line extending through the integrated circuit parallel to the first signal line and being separated from the first signal line by a gap being a fourth distance wide, and wherein a second via connecting the second signal line to the second semiconductor component extends through the gap.

5. The integrated circuit of claim 1, wherein the first signal line and the second signal line are metal signal lines.

6. The integrated circuit of claim 1, wherein the first signal line and the second signal line extend through the integrated circuit in parallel for the third distance.

7. The integrated circuit of claim 6, wherein the third distance is a majority of a length of the integrated circuit.

8. The integrated circuit of claim 1, further comprising:
   a memory comprising an array of storage cells, the first semiconductor component being a first storage cell and the second semiconductor component being a second storage cell,
   wherein the plurality of other semiconductor components comprises a plurality of storage cells of the array, and
   wherein the first signal line and the second signal line each extend across a majority of a length of the memory and across the plurality of storage cells.

9. The integrated circuit of claim 1, wherein the portion of the first signal line and the portion of the second signal line are separated by a fourth distance that limits capacitive coupling between the first signal line and the second signal line.

10. The integrated circuit of claim 1, further comprising:
    a readout circuit to read information signals via the first signal line and the second signal line, and
    wherein the first signal line and the second signal line are electrically connected to the readout circuit via a third signal line.

11. The integrated circuit of claim 10, wherein the readout circuit is configured to select signal lines connected to the third signal line from which to read information signals, and
    wherein the readout circuit is configured not to select a signal line adjacent to a previously-read signal line until after a waiting period.

12. The integrated circuit of claim 11, wherein the readout circuit is configured not to select a signal line adjacent to a previously-read signal line until after the adjacent signal line recovers from a capacitive coupling effect of the previously-read signal line.

13. The integrated circuit of claim 1, wherein the first signal line is a first metal signal line and the second signal line is a second metal signal line.

14. The integrated circuit of claim 1, further comprising:
    a first insulating layer; and
    a second insulating layer,
    wherein:
       the first signal line is disposed on the first insulating layer and is connected to the first semiconductor component by a first via that crosses the first insulating layer; and
       the second signal line is disposed on the second insulating layer and is connected to the second semiconductor component by a second via that crosses the first insulating layer and the second insulating layer.

15. The integrated circuit of claim 1, wherein:
    the first signal line is connected to the first semiconductor component by a single via; and
    the second signal line is connected to the second semiconductor component by a single via.

16. The integrated circuit of claim 1, wherein the portion of the first signal line and the portion of the second signal line are disposed vertically above the plurality of other semiconductor components.

17. An integrated circuit comprising:
a first layer having a first semiconductor component and a second semiconductor component, the first semiconductor component having a first width and comprising a terminal, the terminal having a second width;
a first interconnect layer comprising a first signal line and a second signal line each disposed a first distance from the first layer, the first and second signal lines extending for a third distance through the integrated circuit parallel to one another, the first signal line being separated from the second signal line by a gap having a width that has a fourth distance, wherein the first signal line is electrically connected to the terminal of the first semiconductor component by a via, the first signal line having a third width, the third width being greater than the first width and greater than the second width; and
a third signal line disposed a second distance from the first layer, the second distance being greater than the first distance, the third signal line being electrically connected to the second semiconductor component by a second via, wherein the second via connecting the second signal line to the second semiconductor component extends through the gap between the first signal line and the second signal line,
wherein at least a portion of the second signal line is disposed vertically above at least a portion of the first signal line.

18. An integrated circuit comprising:
a first layer having a first semiconductor component and a second semiconductor component;
a first interconnect layer comprising a first signal line and a second signal line each disposed a first distance from the first layer, the first and second signal lines extending for a third distance through the integrated circuit parallel to one another, the first signal line being separated from the second signal line by a gap having a width that has a fourth distance; and
a third signal line disposed a second distance from the first layer, the second distance being greater than the first distance, the third signal line being electrically connected to the second semiconductor component by a second via, wherein the second via connecting the second signal line to the second semiconductor component extends through the gap between the first signal line and the second signal line,
wherein at least a portion of the second signal line is disposed vertically above at least a portion of the first signal line.

* * * * *